(12) United States Patent
Li et al.

(10) Patent No.: US 8,227,708 B2
(45) Date of Patent: Jul. 24, 2012

(54) VIA STRUCTURE INTEGRATED IN ELECTRONIC SUBSTRATE

(75) Inventors: Xia Li, San Diego, CA (US); Wei Zhao, San Diego, CA (US); Yu Cao, Tempe, AZ (US); Shiqun Gu, San Diego, CA (US); Seung H. Kang, San Diego, CA (US); Ming-Chu King, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 266 days.

(21) Appl. No.: 12/637,104

(22) Filed: Dec. 14, 2009

(65) Prior Publication Data

US 2011/0139497 A1  Jun. 16, 2011

(51) Int. Cl.
*H05K 1/11* (2006.01)

(52) U.S. Cl. ........ 174/262; 257/690; 257/700; 257/762; 257/774; 438/648; 438/677; 438/768; 438/795; 427/576; 428/699

(58) Field of Classification Search .................. 174/262, 174/162; 257/690, 700, 762, 774; 438/648, 438/653, 677, 768, 795; 427/576; 428/699
See application file for complete search history.

(56) References Cited

U.S. PATENT DOCUMENTS

| | | | | |
|---|---|---|---|---|
| 5,275,715 A * | 1/1994 | Tuttle | | 205/123 |
| 5,604,158 A * | 2/1997 | Cadien et al. | | 438/645 |
| 5,627,102 A * | 5/1997 | Shinriki et al. | | 438/648 |
| 5,739,587 A * | 4/1998 | Sato | | 257/758 |
| 5,973,402 A * | 10/1999 | Shinriki et al. | | 257/768 |
| 6,063,703 A * | 5/2000 | Shinriki et al. | | 438/653 |
| 6,066,559 A * | 5/2000 | Gonzalez et al. | | 438/672 |
| 6,122,187 A | 9/2000 | Ahn et al. | | |
| 6,143,377 A * | 11/2000 | Miyamoto | | 427/576 |
| 6,258,716 B1 * | 7/2001 | Ku | | 438/654 |
| 6,448,656 B1 * | 9/2002 | Gonzalez et al. | | 257/774 |
| 6,518,176 B2 * | 2/2003 | Guo et al. | | 438/653 |
| 6,830,838 B2 * | 12/2004 | Sandhu et al. | | 428/699 |
| 2001/0039113 A1 * | 11/2001 | Blalock et al. | | 438/629 |
| 2002/0109233 A1 * | 8/2002 | Farrar | | 257/762 |
| 2003/0236003 A1 * | 12/2003 | Koo et al. | | 438/795 |
| 2004/0188826 A1 * | 9/2004 | Palanduz et al. | | 257/700 |
| 2005/0122288 A1 * | 6/2005 | Fish et al. | | 345/76 |
| 2006/0158280 A1 * | 7/2006 | Jow et al. | | 333/33 |

(Continued)

OTHER PUBLICATIONS

International Search Report and Written Opinion—PCT/US2010/060362, International Search Authority—European Patent Office—Mar. 1, 2011.

(Continued)

*Primary Examiner* — Xiaoliang Chen
(74) *Attorney, Agent, or Firm* — Michelle Gallardo; Nicholas J. Pauley; Jonathan T. Velasco

(57) ABSTRACT

A system of via structures disposed in a substrate. The system includes a first via structure that comprises an outer conductive layer, an inner insulating layer, and an inner conductive layer disposed in the substrate. The outer conductive layer separates the inner insulating layer and the substrate and the inner insulating layer separates the inner conductive layer and the outer conductive layer. A first signal of a first complementary pair passes through the inner conductive layer and a second signal of the first complementary pair passes through the outer conductive layer. In different embodiments, a method of forming a via structure in an electronic substrate is provided.

9 Claims, 16 Drawing Sheets

U.S. PATENT DOCUMENTS

| | | | |
|---|---|---|---|
| 2007/0117382 A1* | 5/2007 | Koo et al. | 438/677 |
| 2008/0197881 A1* | 8/2008 | Bertin | 326/63 |
| 2009/0051011 A1* | 2/2009 | Usami | 257/620 |
| 2009/0108464 A1* | 4/2009 | Uchiyama | 257/774 |
| 2009/0206488 A1 | 8/2009 | Lindgren et al. | |
| 2010/0224980 A1* | 9/2010 | Chahal et al. | 257/690 |
| 2011/0036397 A1* | 2/2011 | Herner | 136/256 |

OTHER PUBLICATIONS

Soon Wee Ho, et al., "Development of coaxial shield via in silicon carrier for high frequency application", Electronics Packaging Technology Conference, 2006, EPTC 06 8TH, IEEE, PI, Dec. 6, 2006, pp. 825-830, XP031333805.

\* cited by examiner

VIA STRUCTURE INTEGRATED IN ELECTRONIC SUBSTRATE

FIELD OF DISCLOSURE

This disclosure relates generally to electronic substrates, and in particular to an electronic substrate having a via structure.

BACKGROUND

Recent developments in packaging technologies for integrated circuits have introduced a through-silicon via (TSV) which is a vertical electrical coupling passing through a silicon wafer or die. TSV is important for creating 3D electrical packages such that conductive layers can be stacked on top of one another and a signal can pass between the conductive layers by utilizing the TSV.

In a conventional packaging design, there can be an array or cluster of TSVs for passing signals between different conductive layers. Besides occupying space in the substrate, the TSVs can also affect the functionality of adjacent or nearby TSVs. For example, mutual inductance between nearby TSVs can cause cross-talk, which in some instances can negatively impact the operation of the electrical package. To reduce the effects of mutual inductance, the space between nearby TSVs is increased and complex calculations based on current densities of signals passing through the TSVs and the frequencies of these signals are required to ensure proper operation of the electrical package.

Another design challenge associated with a TSV is the creation of eddy current losses in the substrate. Eddy currents are formed in the substrate due to changing magnetic fields. As electrical current passes through the TSV, for example, magnetic and electric fields form around the TSV and penetrate the substrate. Changes in the current passing through the TSV may cause changes in the magnetic and electric fields within the substrate. Eddy currents can create an induced magnetic field that opposes the changes in the magnetic field in the substrate. Due to the relatively high resistivity of the substrate, the eddy currents dissipate into the substrate and can generate heat within the substrate. An insulating material can be disposed between the substrate and conductive layer, which can reduce the electric field and attenuate the effects of the magnetic field. However, eddy current losses still remain a problem.

Therefore, it would be desirable to reduce eddy current losses within the substrate and reduce the effects of mutual inductance between nearby TSVs without increasing the space between TSVs.

SUMMARY

In one embodiment, a system of via structures disposed in a substrate is provided. The system includes a first via structure which has an outer conductive layer, an inner insulating layer, and an inner conductive layer disposed in the substrate. The outer conductive layer separates the inner insulating layer and the substrate and the inner insulating layer separates the inner conductive layer and the outer conductive layer. A first signal of a complementary pair passes through the inner conductive layer and a second signal of the complementary pair passes through the outer conductive layer. The first signal and second signal can comprise substantially opposite polarities. Also, an outer insulating layer can also be disposed in the substrate such that the outer insulating layer separates the outer conductive layer and the substrate. Alternatively, a salicide film can be coupled to the outer conductive layer. The salicide film can form a ring-like structure adapted to be coupled to a metal layer.

In another form thereof, the system of via structures can further include a second via structure disposed adjacent to the first via structure. The second via structure can include an inner conductive layer that is surrounded by an outer conductive layer and an inner insulating layer disposed between the inner conductive layer and outer conductive layer. A first signal of a second complementary pair passes through the inner conductive layer and a second signal of the second complementary pair passes through the outer conductive layer. In a different form, the second signal of the first complementary pair and the second signal of the second complementary pair can comprise substantially opposite polarities.

In another embodiment, a method of forming a via structure in an electronic substrate is provided. The method includes forming an opening in the substrate and depositing an outer conductive layer in the opening. The method also includes depositing an inner insulating layer in the opening such that the outer conductive layer separates the inner insulating layer and the substrate. An inner conductive layer is deposited in the opening such that the inner insulating layer separates the outer conductive layer and inner conductive layer. The method further includes contacting the outer conductive layer to a salicide material. In another form thereof, an outer insulating layer can be deposited in the opening such that the outer insulating layer separates the outer conductive layer and the substrate. The salicide material can also be coupled to ground and/or formed as a ring-like structure.

In a different embodiment, a method of reducing electrical or magnetic fields in an electronic device is provided. The method includes forming a first conductive layer in a substrate and surrounding the first conductive layer with an insulating layer. The insulating layer is surrounded by a second conductive layer. The method includes passing a first signal of a complementary pair through the first conductive layer and a second signal of the complementary pair through the second conductive layer such that the second conductive layer is adapted to reduce electrical or magnetic fields produced by the first signal passing through the first conductive layer. In one form thereof, the method includes coupling the second conductive layer to a first potential. In another form thereof, the method includes coupling the second conductive layer to a salicide material. The method can also include forming another insulating layer that surrounds the second conductive layer.

In another exemplary embodiment, a via structure for reducing electrical or magnetic fields in an electronic device is provided. The via structure includes a first conductive means for conducting a first signal of a complementary pair in a substrate and a second conductive means for conducting a second signal of the complementary pair in the substrate. The via structure also includes an insulating means for insulating the first conductive means from the second conductive means. The first signal and second signal comprise substantially opposite polarities.

For a more complete understanding of the present disclosure, reference is now made to the following detailed description and the accompanying drawings.

DETAILED DESCRIPTION

Figure 1:
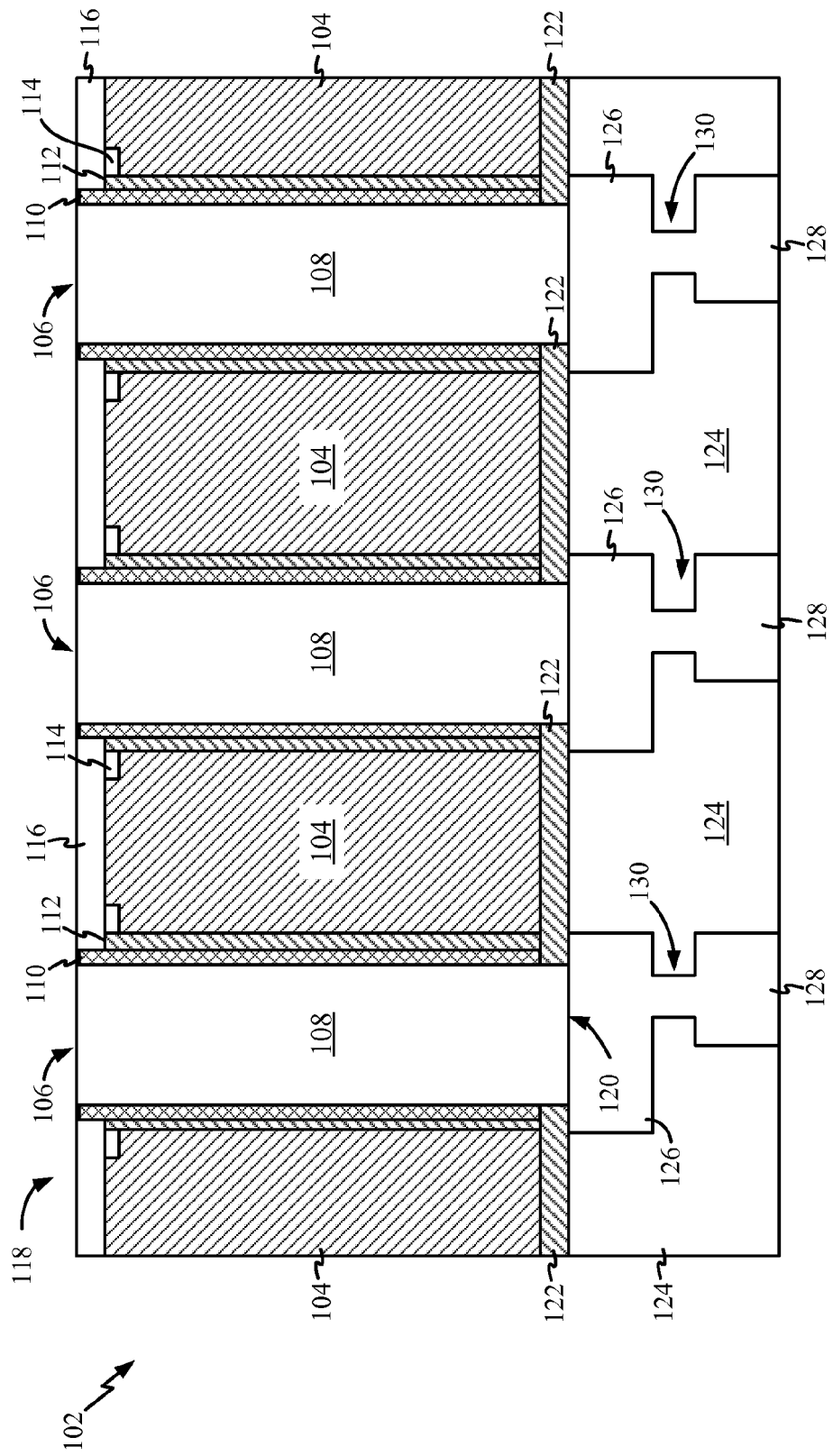
FIG. 1 is a sectional view of a first embodiment of an electronic structure having a plurality of shielded vias in a substrate.

Referring to the embodiment shown in FIG. 1, an electronic structure 102 is provided. The electronic structure 102 includes a substrate 104 with a plurality of TSVs 106 disposed therein. Although not shown, in various embodiments the plurality of TSVs 106 can be arranged in the substrate as an array or cluster of TSVs. The substrate 104 can be made of materials such as silicon, silicon carbide, silicon dioxide, silicon nitride, or any other substrate material known to the skilled artisan. The substrate 104 can be a multilayer substrate such as a buildup or laminate multilayer printed circuit board, or a buildup or laminate package substrate.

Each of the plurality of TSVs 106 includes a conductive layer 108, an insulating or dielectric layer 110, and a shield layer 112 which can be in contact with the substrate 104. The insulating or dielectric layer 110 is positioned between the conductive layer 108 and shield layer 112. The insulating or dielectric material 110 can be made of an oxide, such as silicon dioxide ($SiO_2$), silicon oxynitride (SiON), silicon nitride (SiN), or other known dielectric material.

The shield layer 112 can be made from material including titanium (Ti), titanium nitride (TiN), tantalum (Ta), tantalum nitride (TaN), a combination thereof or other like material known to a skilled artisan. The shield layer 112 can also be made of a magnetic material. In one embodiment, the shield layer thickness can be approximately 10-100 nm, although in other embodiments the thickness can be more or less depending on the layout of the substrate 104 and the desired shielding characteristics.

In the embodiment shown in FIG. 1, the shield layer 112 can be described as a "coaxial" shield layer 112 integrated within the substrate 104 as the shield layer 112 extends from the front surface 118 to the backside 120 of the substrate 104 and can be coaxial with the conductive layer 108 of the TSV 106. However, the actual alignment of the shield layer 112 and the conductive layer 108 does not have to be coaxial. Near the front surface 118 of the substrate 104 there can be a front layer of dielectric material 116 that can comprise silicon dioxide ($SiO_2$), silicon oxynitride (SiON), silicon nitride (SiN), or other dielectric material. On the backside 120 of the substrate 104 there can be a diffusion barrier dielectric film 122 that can include material such as silicon carbide (SiC), silicon nitride ($Si_3N_4$), and the like.

The shield layer 112 can be coupled to ground by means of a salicide film 114. The salicide film 114 can take any shape, but in one aspect, the salicide film 114 comprises a ring around the front surface 118 of the TSV 106. The salicide film 114 may be coupled to ground, and can be used to provide better contact between the shield layer 112 and ground. To couple the salicide film 114 to ground, the salicide film 114 can be coupled to a metal layer (which is grounded) above the substrate 104 (see FIG. 2).

As also shown in the embodiment of FIG. 1, each conductive layer 108 of the plurality of TSVs 106 can be coupled to a first back metal layer 126, i.e., "Back Metal 1." A second back metal layer 128, i.e., "Back Metal 2" can also be formed on the backside 120 of the substrate 104 and a back via structure 130 can couple the first back metal layer 126 to the second back metal layer 128. A dielectric material 124 such as silicon dioxide ($SiO_2$), silicon oxynitride (SiON), silicon nitride (SiN), or the like can fill the remaining area on the backside 120 of the substrate 104.

Figure 2:
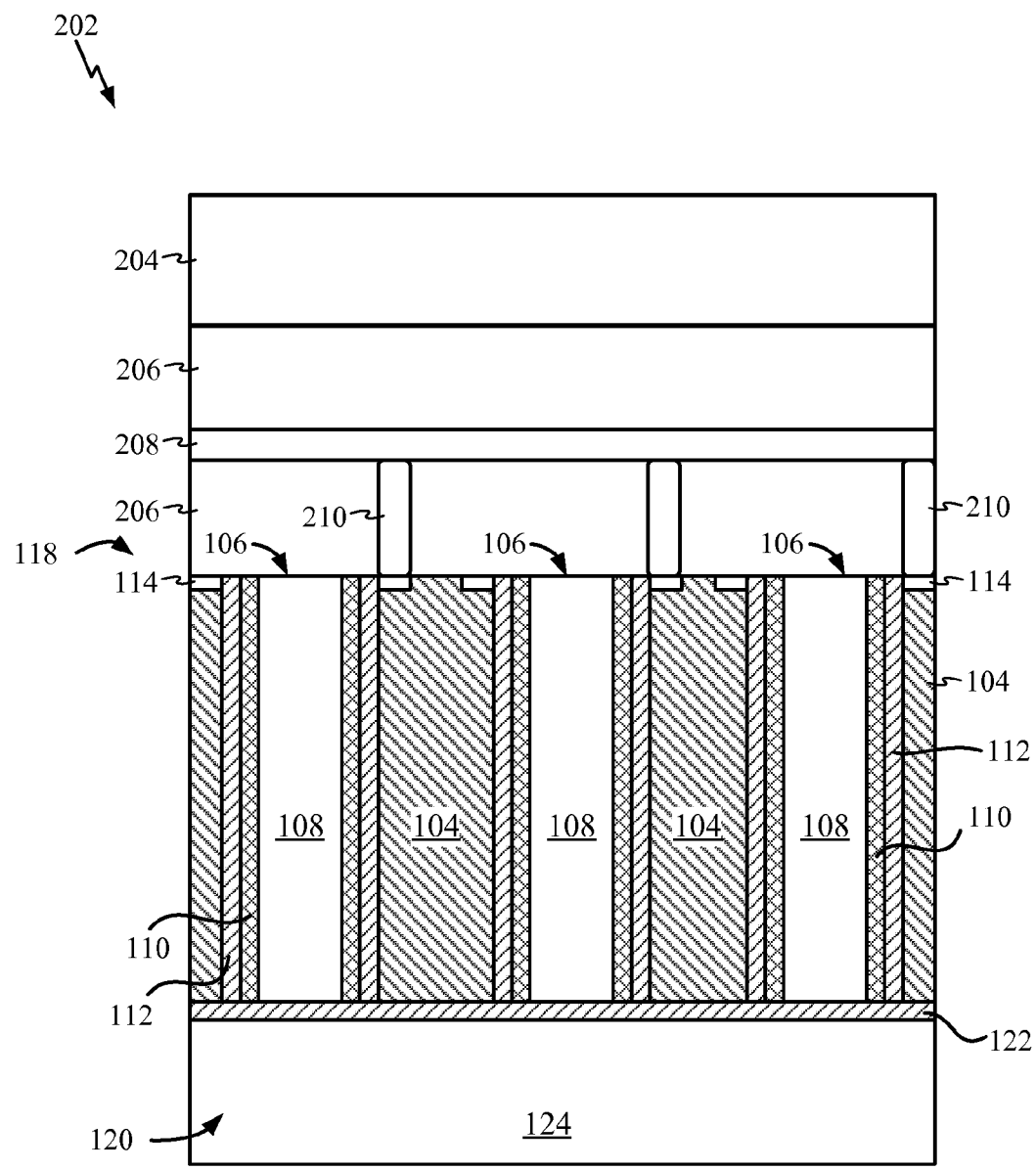
FIG. 2 is a sectional view of a multilayer electrical package having a plurality of shielded vias in a multilayer substrate.

In the embodiment shown in FIG. 2, a multilayer electrical package 202 is provided in which only the front portion or surface of the substrate is finished (i.e, the backside 120 of the substrate 104 is not shown having been finished). The multilayer electrical package 202 comprises a top or upper metal layer 204, a second metal layer 208 which is coupled to ground, and a plurality of shielded TSVs 106 in a substrate 104. Dielectric or insulating material 206 is disposed between the top or upper metal layer 204 and the ground layer 208 (i.e., the second metal layer) and between the ground layer 208 and the front surface 118 of the substrate 104. Additional conducting and nonconducting layers can also be disposed on the front side of the substrate 104.

Each of the plurality of TSVs 106 includes an inner conductive layer 108, a dielectric or insulating layer 110, and a shield layer 112. As described with reference to FIG. 1, a diffusion barrier dielectric film 122 and dielectric material 124 can fill the area on the backside 120 of the substrate 104. Although in FIG. 2 the diffusion barrier 122 and dielectric material 124 are shown covering the entire backside 120 of the substrate 104, a backside thinning process may be incorporated to open the TSVs 106 on the backside 120 of the substrate 104.

Also, in the embodiment of FIG. 2, the shield layer 112 can be in contact with the substrate 104 and a salicide film 114 can contact the shield layer 112 to the ground layer 208. This can be achieved by using a contact 210 that couples the salicide film 114 to the ground layer 208. Alternatively, other conventional methods for contacting the salicide film 114 to ground can be used.

One advantage of a through via having a shield layer described herein is that the shield layer substantially reduces mutual inductance between nearby TSVs. For example, in a 3×3 through silicon via (TSV) array in which no shield layer is present, the mutual inductance impact between TSVs can be about 0.15 nH. In such an arrangement, the vias can have a radius of about 3 µm, a height of about 50 µm, and be spaced apart by about 3 µm. In the embodiment of FIG. 1, however, the shield layer 112 substantially reduces or eliminates mutual inductance between through vias 106 without having to increase the space between adjacent through vias 106 in the substrate 104. Thus, in a substrate that can include over 1000 TSVs, the shield layer allows adjacent TSVs to be spaced about 3 µm apart and the mutual inductance impact between TSVs is negligible (i.e., approximately 0 nH). Also, the thickness of the shield layer can be increased to further reduce the mutual inductance between TSVs.

A shield layer can also prevent the electrical field produced by the TSV from affecting the surrounding components of the electrical package and reduce the effect of the magnetic field. Another advantage of a TSV with a shield layer is the substantial or complete reduction of eddy current losses in an electronic substrate. Eddy current losses therefore can be substantially or completely reduced in the electronic substrate. A through via with a shield layer can also advantageously reduce electromagnetic noise within the substrate. These reductions or eliminations of unwanted side effects by using a shield layer can allow TSVs to be placed closer together and other components to be placed closer to the shielded TSVs.

Figure 3:
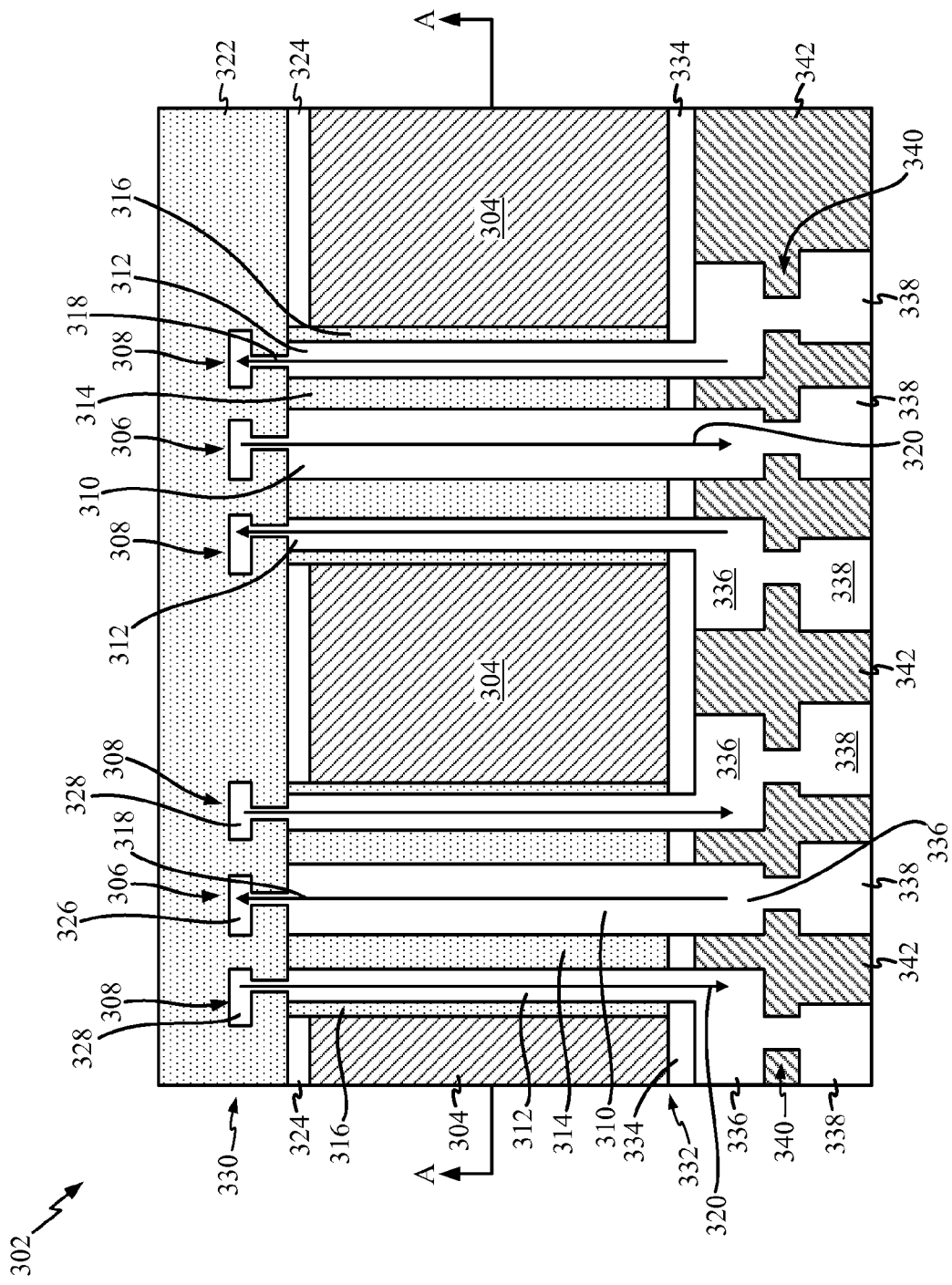
FIG. 3 is a sectional view of a second embodiment of an electronic structure having a plurality of dual via structures in a substrate.

Referring to the exemplary embodiment shown in FIG. 3, an electronic structure 302 is provided. The electronic structure 302 includes a substrate 304 with an inner via 306 and outer via 308 disposed therein. The outer via 308 "coaxially" surrounds the inner via 306 in the substrate 304, although in other embodiments, the actual alignment of the inner via 306 and outer via 308 does not have to be coaxial. The arrangement of the outer via 308 surrounding the inner via 306 can be described as a "dual via" structure in the substrate 304. The arrangement can also be referred to as a "ring-type pair" via structure disposed in a multilayer substrate. It is possible that the arrangement of the inner via 306 and outer via 308 can be disposed in the substrate 304 as an array or cluster of vias.

The substrate 304 can be made of material such as silicon (Si), silicon carbide (SiC), silicon dioxide ($SiO_2$), silicon nitride ($Si_3N_4$), or any other substrate material known to the skilled artisan. The substrate 304 can be a multilayer substrate such as a buildup or laminate multilayer printed circuit board, or a buildup or laminate package substrate. In one embodiment, the substrate 304 is part of a Complementary Metal Oxide Semiconductor (CMOS) wafer.

The inner via 306 and outer via 308 form inner and outer signal paths, respectively, such that a signal can pass through a conductive layer of each via. In the embodiment of FIG. 3, for example, the inner via 306 comprises an inner conductive layer 310 through which a signal can pass. The outer via 308 comprises an outer conductive layer 312 through which a signal can pass and that surrounds the inner conductive layer 310. The inner via 306 and outer via 308 can comprise a ring or circular cross-section, or it can form a rectangular, semicircular or other shaped cross-section. The inner conductive layer 310 is separated from the outer conductive layer 312 by an inner insulating or dielectric layer 314. Further, an outer insulating or dielectric layer 316 separates the outer conductive layer 312 and the substrate 304. The inner insulating or dielectric layer 314 can be a separate layer from the outer insulating or dielectric layer 316 or both layers can comprise the same layer. As such, the inner insulating or dielectric layer 314 can be the same or different material as the outer insulating or dielectric layer 316. The insulating or dielectric layers can be made, for example, of an oxide, such as silicon dioxide ($SiO_2$), silicon oxynitride (SiON), silicon nitride ($Si_3N_4$), or other known dielectric material. The conductive layers can be made of copper, aluminum or other known conductive materials.

Near the front surface 330 of the substrate 304 there can be a front layer of dielectric material 324 that comprises silicon dioxide ($SiO_2$), silicon oxynitride (SiON), silicon nitride ($Si_3N_4$), a combination thereof, or other dielectric material. Likewise, on the backside 332 of the substrate 304 there can be a diffusion barrier 334, i.e., dielectric film, which can include material such as silicon carbide (SiC), silicon nitride ($Si_3N_4$), and the like.

In FIG. 3, the inner conductive layer 310 can couple to an inner contact 326 and the outer conductive layer 312 can couple to an outer contact 328 near the front surface 330 of the substrate 304. The inner contact 326 and outer contact 328 can couple to different surfaces of the same metallic layer. Alternatively, the inner contact 326 and outer contact 328 can couple to surfaces of different metallic layers.

The front-side area 330 (i.e., near the front surface of the substrate 304) can comprise an insulating or dielectric material 322. The insulating or dielectric material 322 can comprise the same material as the inner insulating layer 314 and/or the outer insulating layer 316 such that the inner conductive layer 310 and outer conductive layer 312 are isolated from each other and the substrate 304. Alternatively, the insulating or dielectric material 322 can comprise different material than the inner insulating layer and/or outer insulating layer 316. On the backside 332 of the substrate 304, a dielectric material 342 fills the area around a first back metal layer 336 and a second back metal layer 338. The dielectric material 342 can comprise silicon dioxide ($SiO_2$), silicon oxynitride (SiON), silicon nitride ($Si_3N_4$), a combination thereof, or the like.

The inner conductive layer 310 of the inner via 306 couples to a contact or surface of the first back metal layer 336. Likewise, the outer conductive layer 312 of the outer via 308 couples to a different contact or surface of the first back metal layer 336. Thus, while the inner conductive layer 310 and outer conductive layer 312 can be coupled to contacts of the same first back metal layer 336, both conductive layers couple to different surfaces or contacts. Alternatively, the inner conductive layer 310 can couple to a contact or surface of a different back metal layer than the outer conductive layer 312. In the embodiment of FIG. 3, a back via 340 couples the first back metal layer 336 to the second back metal layer 338.

Figure 4:
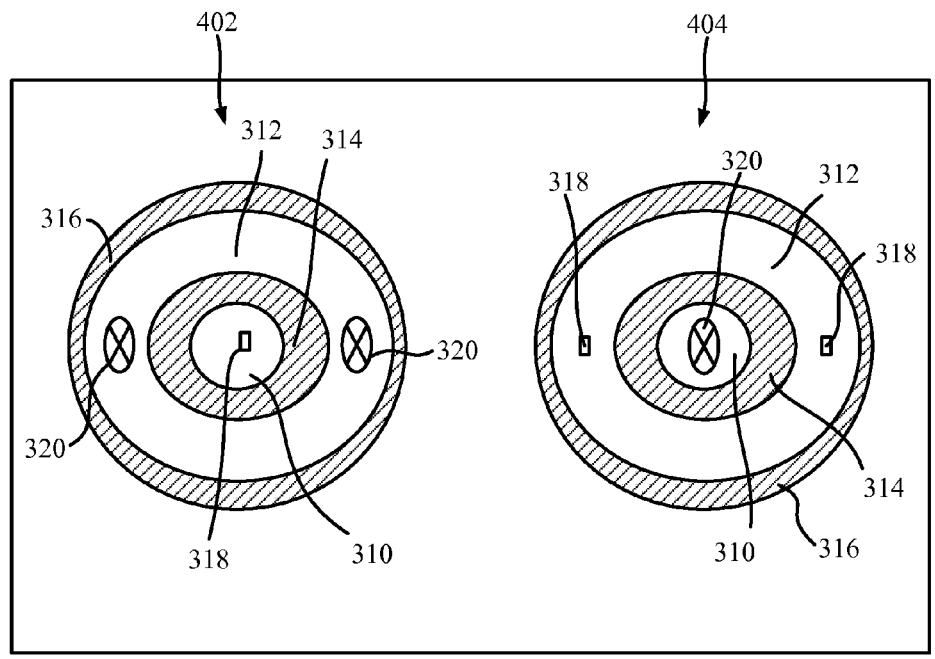
FIG. 4 is a sectional top view of the electronic structure of FIG. 3 taken along line A-A.

With reference to the embodiment depicted in FIGS. 3 and 4, the inner conductive layer 310 forms an inner signal path and the outer conductive layer 312 forms an outer signal path. A first signal can pass through the inner conductive layer 310 in a first direction 318, and a second signal can pass through the outer conductive layer 312 in a second direction 320. To reduce or eliminate mutual inductance in the substrate 304, the first signal can be the same as the second signal, but the first direction 318 is opposite the second direction 320. Hence, the two signals comprise a differential pair. Alternatively, a first signal of a complementary pair passes through the inner conductive layer 310 and a second signal of the complementary pair passes through the outer conductive layer 312. The first signal and second signal can comprise opposite polarities.

By passing the same signal through the different conductive layers, there is substantially no net current passing through the inner via 306 and outer via 308. This can also reduce the electromagnetic noise in the substrate 304, the mutual inductance between nearby vias, and the total inductance of each via. In an alternative embodiment, the first signal and second signal can pass through the inner conductive layer 310 and outer conductive layer 312 in the same direction and thus both signals comprise a common pair.

Another advantage associated with this particular arrangement is the ability to place multiple vias in close proximity. In the embodiment of FIG. 4, a first dual via structure 402 is shown with the signal passing in the first direction 318 (i.e., into the substrate 304) through the inner conductive layer 310. The signal passes in the second direction 320 (i.e., out of the substrate 304) through the outer conductive layer 312. As described with reference to FIG. 3, the mutual inductance is reduced as the differential pair of signals pass in opposite directions through both conductive layers. A similar advantage can be found, for example, in a system of dual via structures that includes the first dual via structure 402 and a second dual via structure 404. The second dual via structure 404 includes an inner conductive layer 310 through which a differential signal passes in the second direction 320 and an outer conductive layer 312 through which the signal passes in the first direction 318. As shown in FIGS. 3-4, the differential signal passes through the outer conductive layer 312 of the first dual via structure 402 in the second direction 320, whereas the differential signal passes through the outer conductive layer 312 of the second dual via structure 404 in the first direction 318. As the differential signals comprise opposite polarities, mutual inductance between the two dual via structures 402 and 404 is reduced or eliminated. In addition, the differential signal that passes through the inner and outer conductive layers of the first dual via structure 402 may differ in magnitude, frequency, direction, or phase from the signal that passes through the conductive layers of the second dual via structure 404. Alternatively, both signals may comprise substantially the same magnitude, frequency, direction, or phase.

In a non-limiting, exemplary embodiment, the first dual via structure 402 can be spaced apart from the second dual via structure 404 by approximately 3-20 μm. The inner conductive layer 310 in both inner vias 306 can have a diameter or thickness of about 1-10 μm and the outer conductive layer 312 can have a thickness of 1-5 μm. Therefore, the dual via structures can occupy less space in the substrate, and by passing the differential pair of signals in opposing directions through the outer conductive layers of adjacent dual via structures, the mutual inductance impact is lessened therebetween.

In another embodiment, the outer conductive layer 312 can be coupled to ground for reducing or eliminating electric fields and magnetic fields from forming in the substrate 304. The outer conductive layer 312 can act as a shield disposed in the substrate 304 such that electric fields are confined or blocked between the outer conductive layer 312 and the inner conductive layer 310. In this embodiment, the outer insulating layer 316 separates the outer conductive layer 312, i.e., the shield layer, and the substrate 304. As such, the inner conductive layer 310 forms a through via 306.

The outer conductive layer 312 can be coupled to ground in any manner known to the skilled artisan. For example, in FIG. 3, the outer conductive layer 312 can be coupled to a front metal layer which in turn is coupled to ground. In this particular embodiment, the inner conductive layer 310 also couples to a front metal layer which is not coupled to ground.

An outer conductive layer 312 coupled to ground in the present embodiment can also prevent an electric field produced within the via from affecting the surrounding components of an electrical package, for example, and reduces the effect of the magnetic field. Another advantage is the substantial or complete reduction of eddy current losses in an electronic substrate. A through via in this embodiment can also advantageously reduce electromagnetic noise within the substrate. These reductions or eliminations of unwanted side effects by coupling the outer conductive layer 312 to ground can allow through vias to be placed closer together and other components to be placed closer to the through vias.

One exemplary method of forming a shielded through via structure in a substrate, such as the structure illustrated in FIG. 1, can include: a) forming an opening in the substrate; b) depositing a shield layer within the opening in the substrate to contact the shield layer with the substrate; c) depositing an insulating layer within the opening in the substrate such that the shield layer separates the substrate and the insulating layer; and d) depositing a conductive layer in the opening in the substrate such that the insulating layer separates the shield layer and conductive layer.

A conventional process of fabricating an integrated circuit, for example, can include a front-end-of-the-line (FEOL) process in which individual devices (i.e., transistors, resistors, etc.) are patterned in a wafer or die. This process can include a salicidation process and a process of preparing multiple layers of material (e.g., conductive layers) to form the substrate. The fabrication process can further include depositing an interlayer dielectric (ILD) layer on the substrate.

A through via can be prepared in a substrate by forming an opening or through hole in the substrate. The opening or through hole can be formed by punching, drilling, or lasing. Another conventional method includes applying a mask to a surface of the substrate and utilizing an etching process to form the opening or through hole in the substrate. The method of forming the opening or through hole can depend on the size and location of the opening or hole, along with other considerations such as access and convenience.

Figure 5:
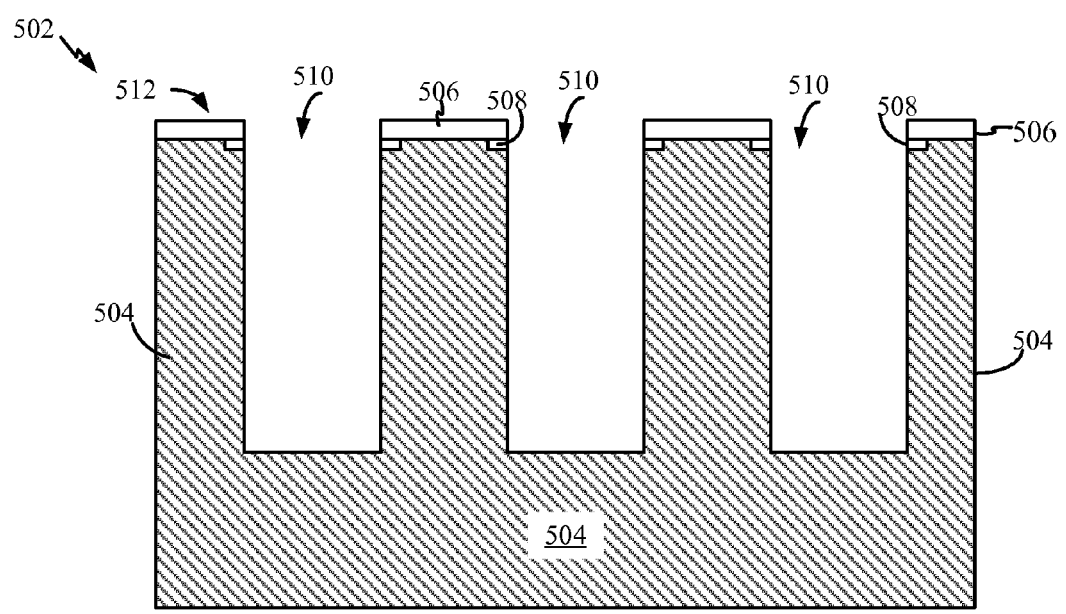
FIG. 5 is a sectional view of a first embodiment of an electronic structure having a plurality of openings formed in a substrate.
Figure 6:
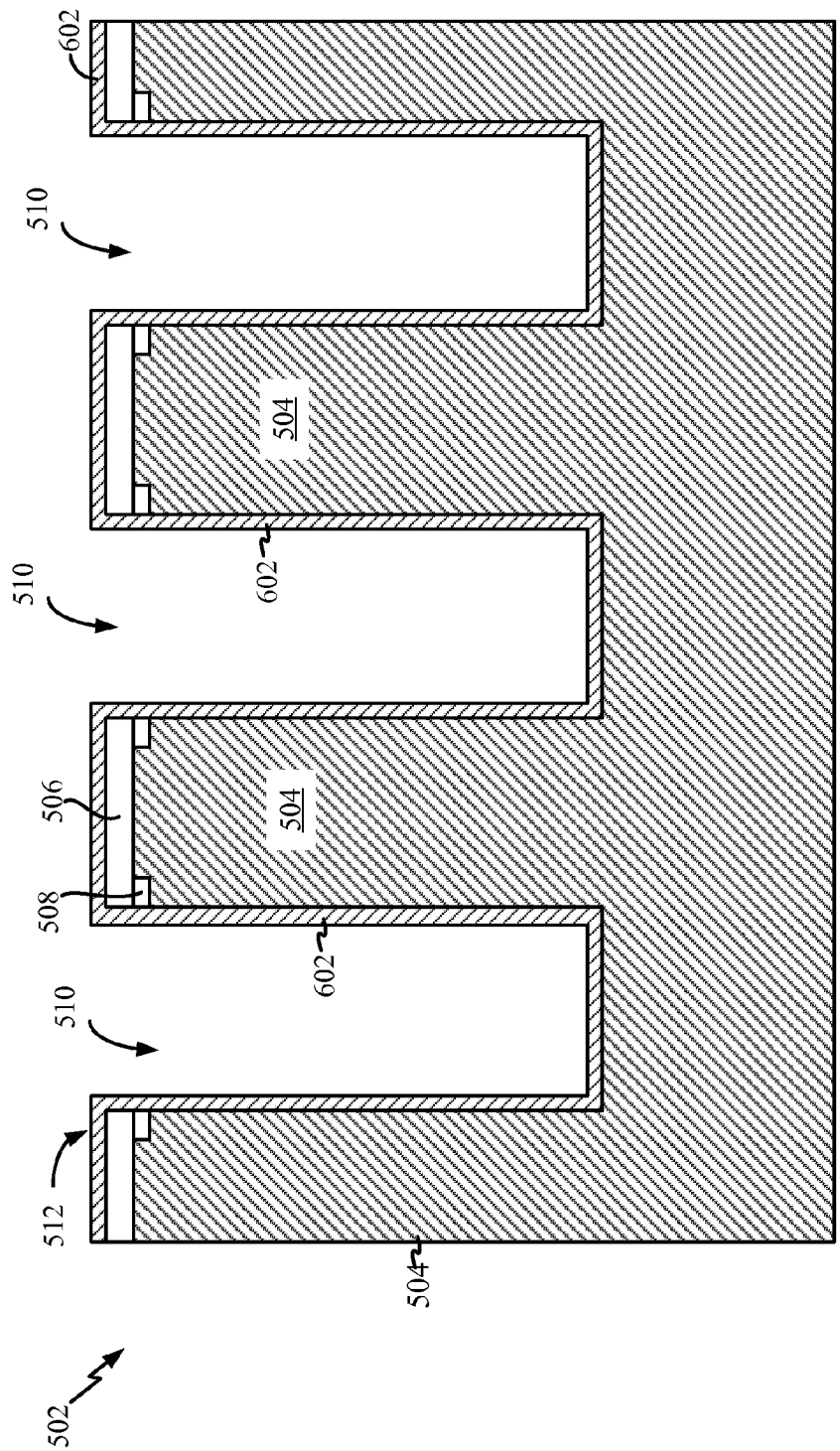
FIG. 6 is a sectional view of the electronic structure of FIG. 5 deposited with a shielding layer.

In an exemplary embodiment shown in FIGS. 5-11, a method of preparing a shielded through via structure is shown. In FIG. 5, an electronic structure 502 is provided. The electronic structure 502 includes a substrate 504 with a plurality of openings 510 formed therein. Near the front or top surface 512 of the substrate 504 is a layer of dielectric material 506 and a salicide film 508. In FIG. 6, a shield layer 602 is deposited along the front or top surface 512 of the substrate 504 and the inner walls of the plurality of openings 510. The process of depositing the shield layer 602 can include, for example, a plating or other suitable process. The shield layer 602 is contacted with the salicide film 508. Since the salicide film 508 will be coupled to ground (not shown), contacting the shield layer 602 with the salicide film 508 thereby will couple the shield layer 602 to ground. Also, in various embodiments, the substrate can be coupled to ground. Thus, in those embodiments, the salicide film 508 and shield layer 602 can provide a low resistance path to ground.

Figure 7:
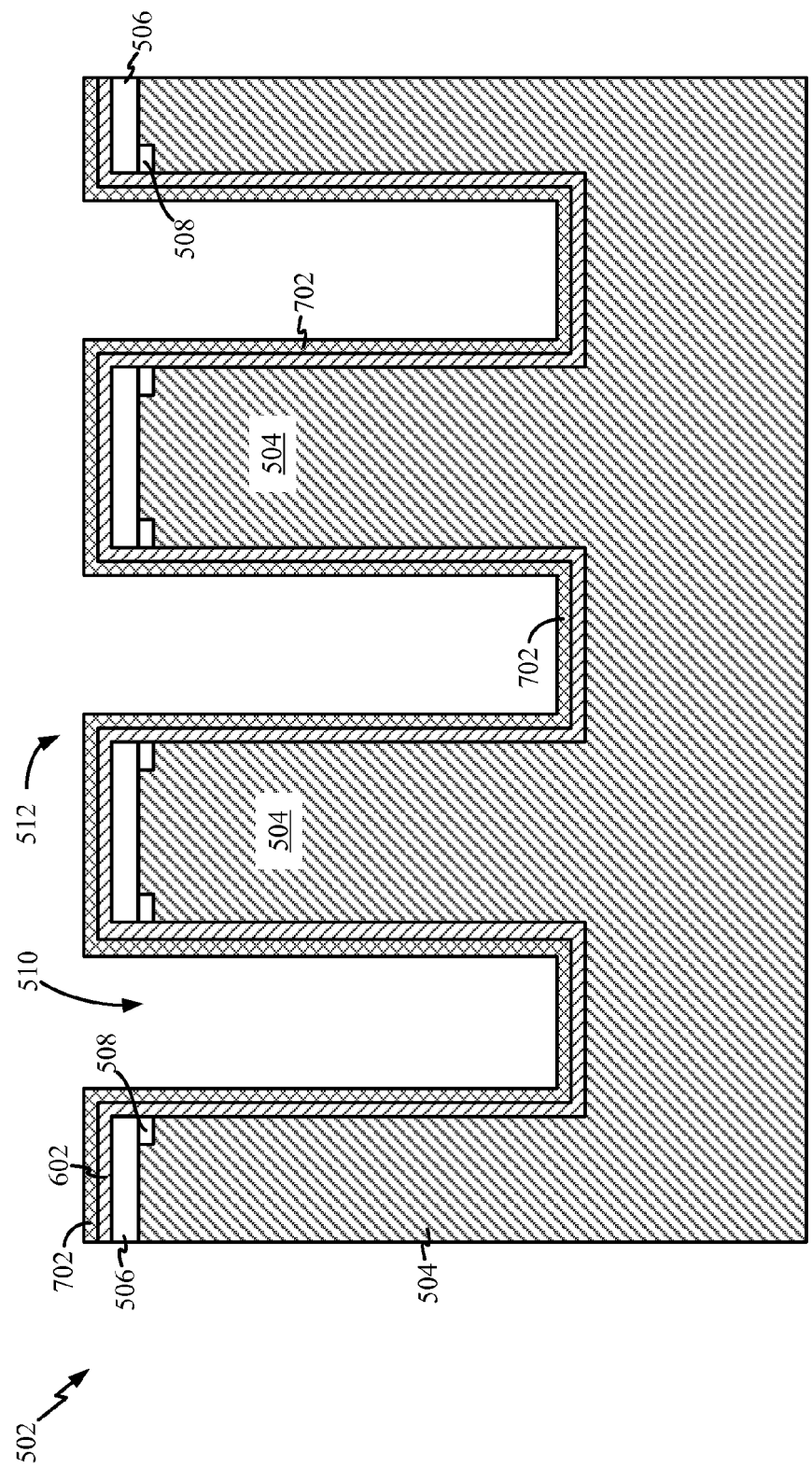
FIG. 7 is a sectional view of the electronic structure of FIG. 6 deposited with a insulating layer.
Figure 8:
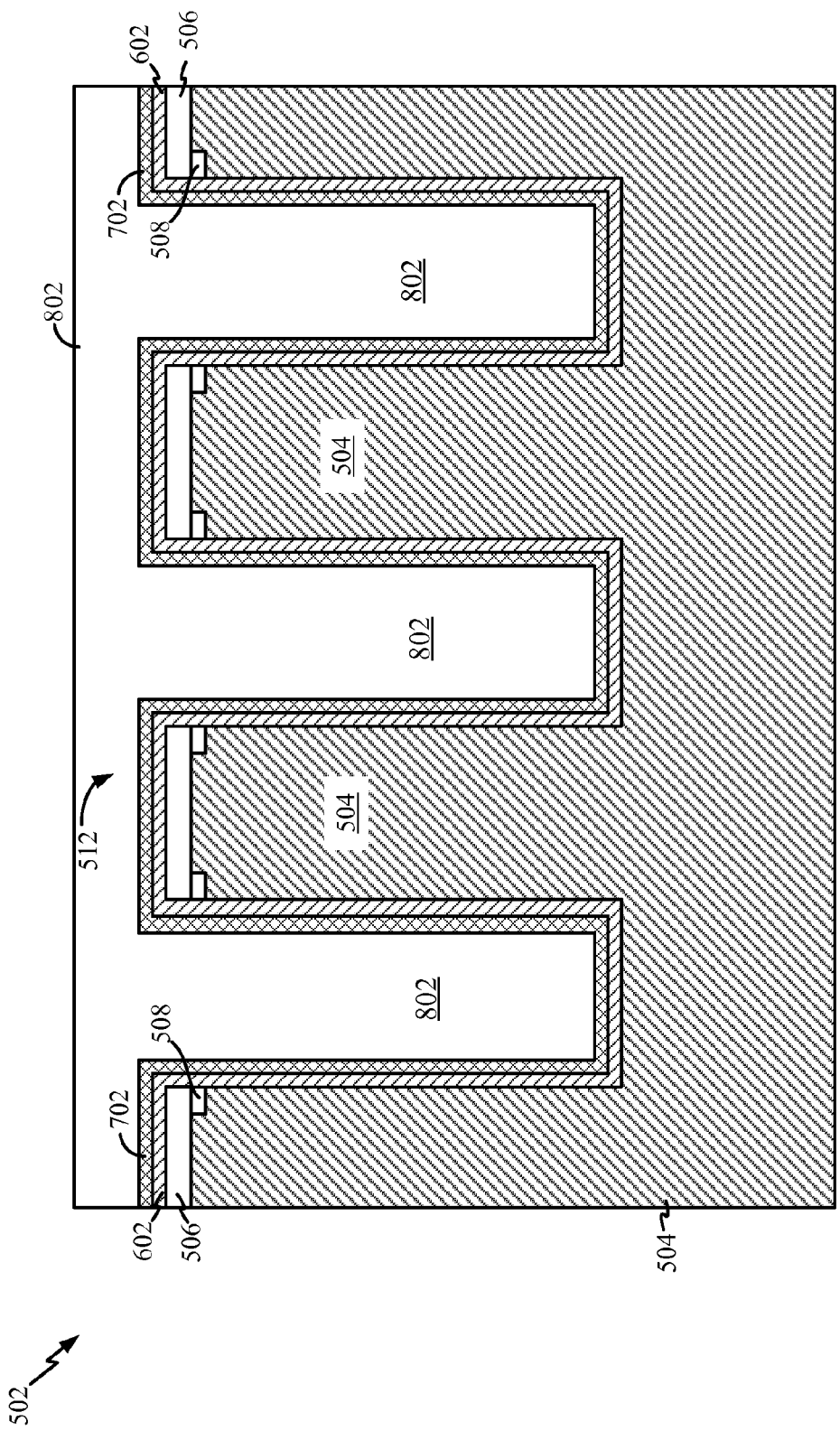
FIG. 8 is a sectional view of the electronic structure of FIG. 7 plated with a conductive material.
Figure 9:
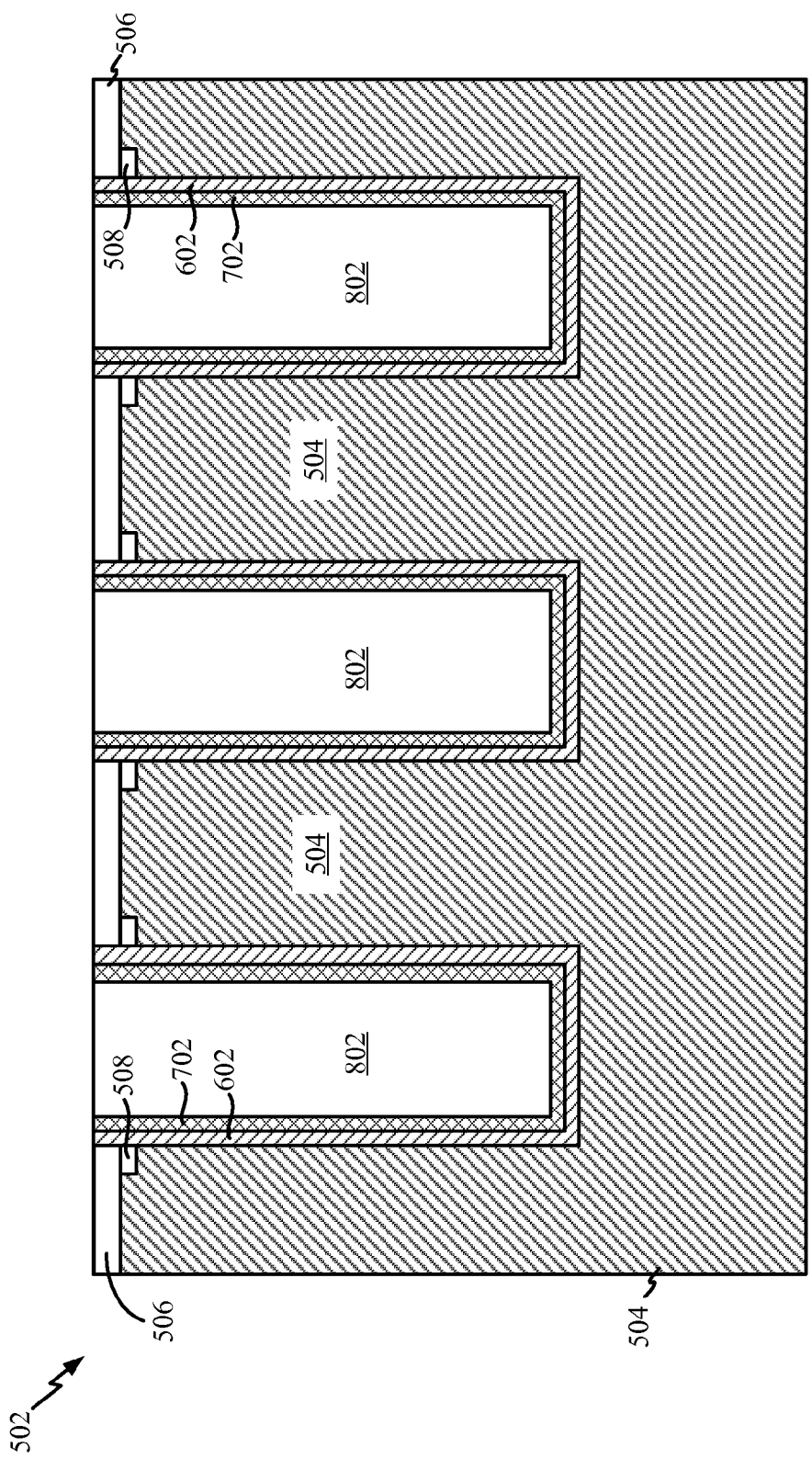
FIG. 9 is a sectional view of the electronic structure of FIG. 8 with a polished front surface of the substrate.
Figure 10:
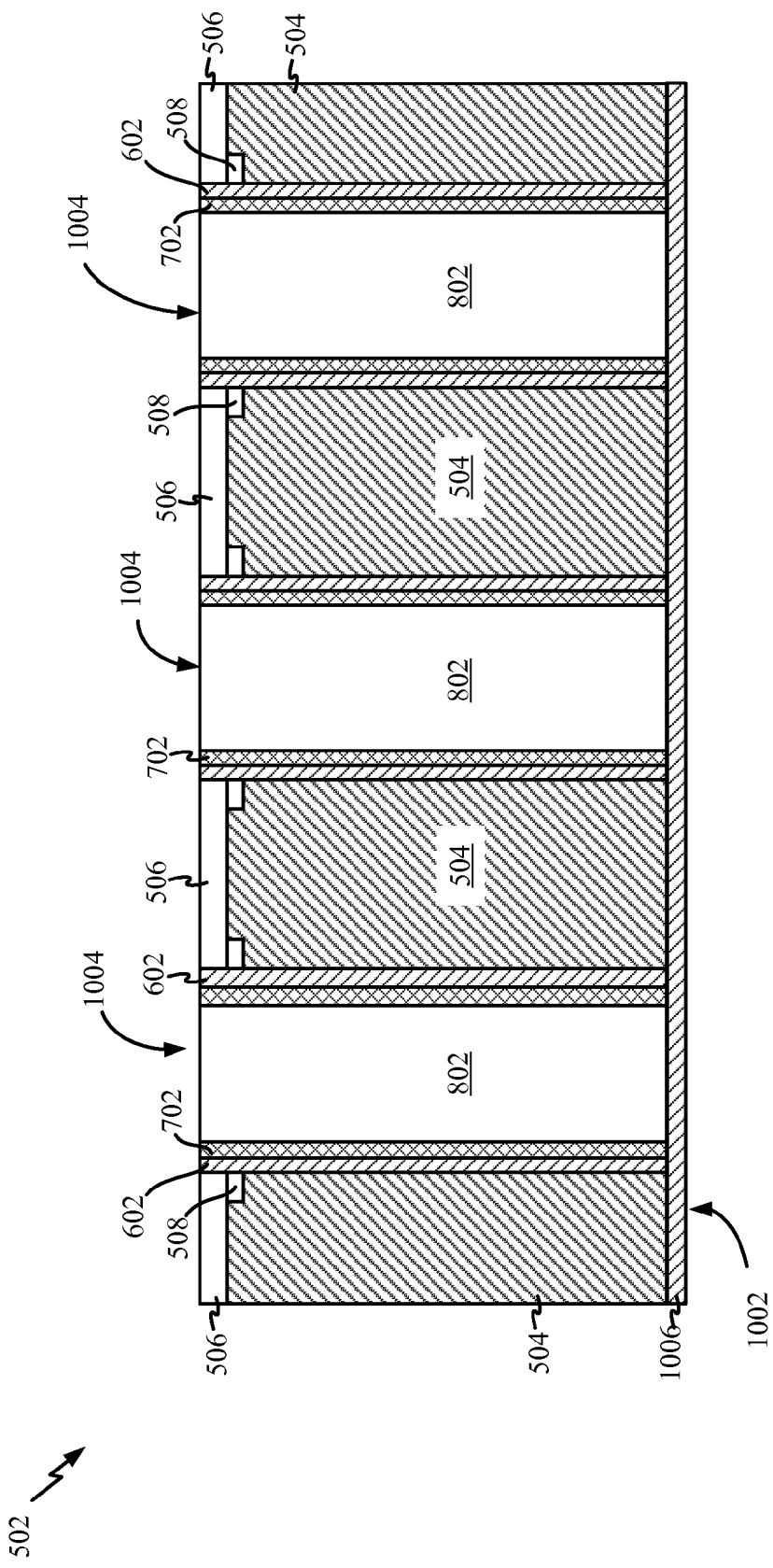
FIG. 10 is a sectional view of the electronic structure of FIG. 9 with a plurality of through vias after backside substrate thinning.

In FIG. 7, an insulating or dielectric layer 702 is deposited such that the shield layer 602 is disposed between the substrate 504 and the insulating or dielectric layer 702. The insulating or dielectric layer 702 can be deposited on the front or top surface 512 of the substrate 504 (e.g., on top of the shield layer 602 in FIG. 7) and along the inner walls of the plurality of openings 510. In FIG. 8, a conductive material 802, such as copper, is plated in the plurality of openings 510 and over portions of the dielectric material 702 near the front or top surface 512 of the substrate 504. The plating process can also be, for example, an electrodeposit or other known deposit process. The top portions of the conductive material 802, insulating or dielectric material 702, and shield layer 602 can then be etched or polished by a chemical mechanical polishing (CMP) process or other known process to remove excess material deposited during the fabrication, as shown in FIG. 9. Material on the backside 1002 of the substrate 504 can also be removed by an etching or thinning process to remove excess material, as shown in FIG. 10, such that a plurality of through vias 1004 are formed. In addition, a diffusion barrier dielectric film 1006 such as silicon dioxide ($SiO_2$), silicon oxynitride (SiON), silicon nitride (SiN), or other known dielectric material can be deposited on the backside 1002 of the substrate 504.

Figure 11:
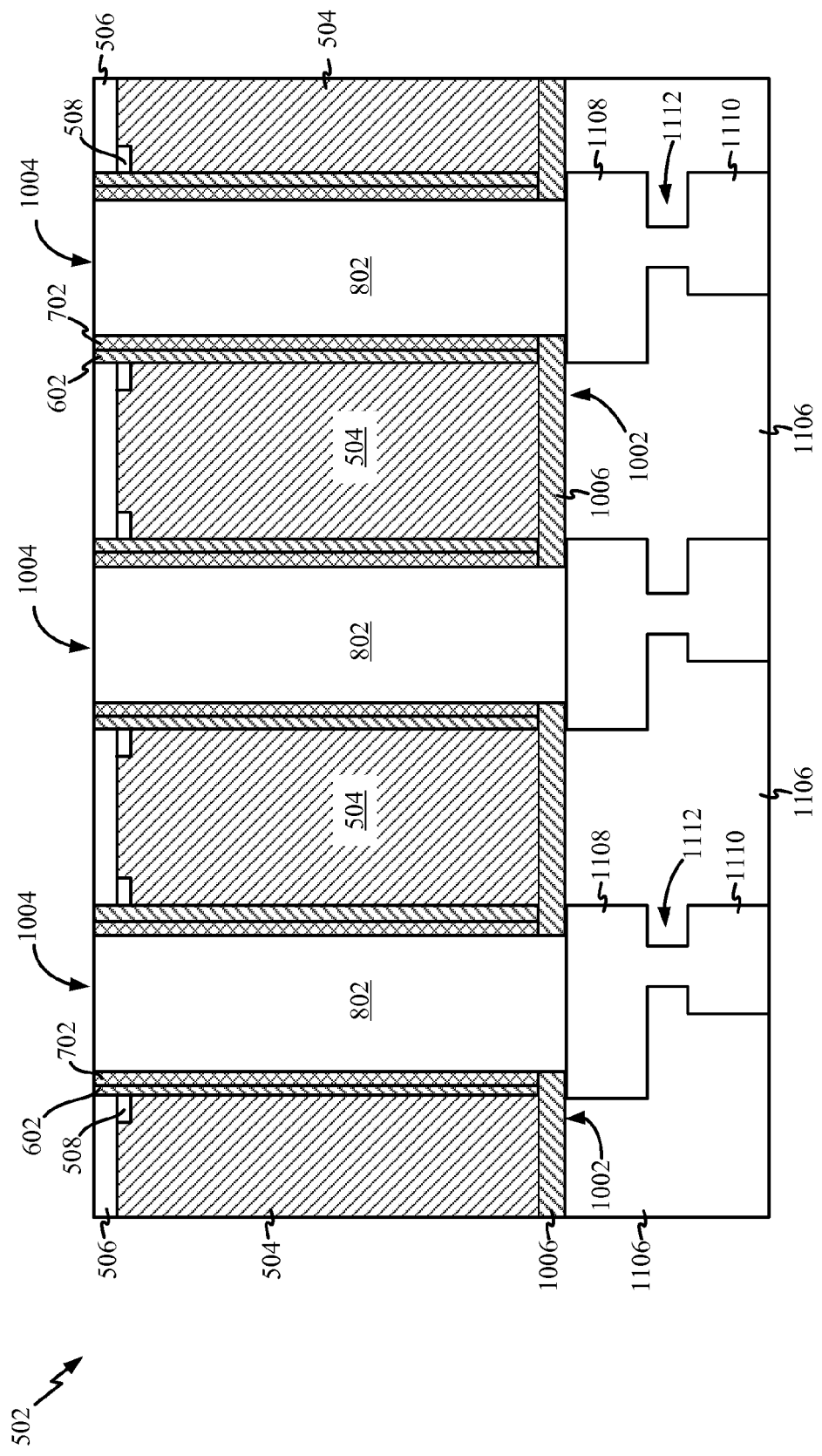
FIG. 11 is a sectional view of the electronic structure of FIG. 10 with a plurality of through vias with dielectric material filled on the backside of the substrate.

In FIG. 11, an electronic structure 502 with a plurality of shielded through vias 1004 is shown. The backside 1002 of the substrate 504 can include a first metal ("Back Metal 1") 1108 and a second metal ("Back Metal 2") 1110. The first metal 1108 can fill an opening near the bottom of the conductive layer 802 to couple with the plurality of through vias 1004. A back via 1112 can be formed between the first metal 1108 and the second metal 1110. In addition, a dielectric material 1106 can be filled around the first metal 1108, second metal 1110, and back via 1112. Additional logic back-end-of-the-line (BEOL) processes can take place as needed.

Although in the embodiment shown in FIGS. 5-11, the electronic substrate 502 is described having a plurality of through vias 1004 formed therein, in other embodiments it is possible to have one or more through vias, individually or in arrays or clusters, formed in the substrate 502.

In an alternative embodiment, the shield layer 602 can be made of a magnetic material. The magnetic material of the shield layer 602 can confine or reduce magnetic fields and electric fields outside of the through via 1004 as an electric current passes through the conductive layer 802. Likewise, the magnetic material of the shield layer 602 can protect the inside of the through via 1004 from an external electromagnetic field.

An exemplary method of forming a dual via structure in an electronic substrate can include: a) forming an opening in the substrate; b) depositing an outer insulating layer in the opening in the substrate; c) depositing an outer conductive layer within the opening such that the outer insulating layer separates the outer conductive layer and the substrate; d) depositing an inner insulating layer in the opening such that the outer conductive layer separates the outer insulating layer and the inner insulating layer; and e) depositing an inner conductive layer in the opening such that the inner insulating layer separates the outer conductive layer and the inner conductive layer.

A conventional process of fabricating an integrated circuit, for example, can include a front-end-of-the-line (FEOL) process in which individual devices (i.e., transistors, resistors, etc.) are patterned in a wafer or die. This process can include a salicidation process and a process of preparing multiple layers of material (e.g., conductive layers) to form the substrate. The fabrication process can further include depositing an interlayer dielectric (ILD) layer on the substrate.

A dual via structure can be prepared in a substrate by forming an opening or through hole in the substrate. The opening or through hole can be formed by punching, drilling, or lasing. Another conventional method includes applying a mask to a surface of the substrate and utilizing an etching process to form the opening or through hole in the substrate. The method of forming the opening or through hole can depend on the size and location of the opening or hole, along with other considerations such as access and convenience.

Figure 12:
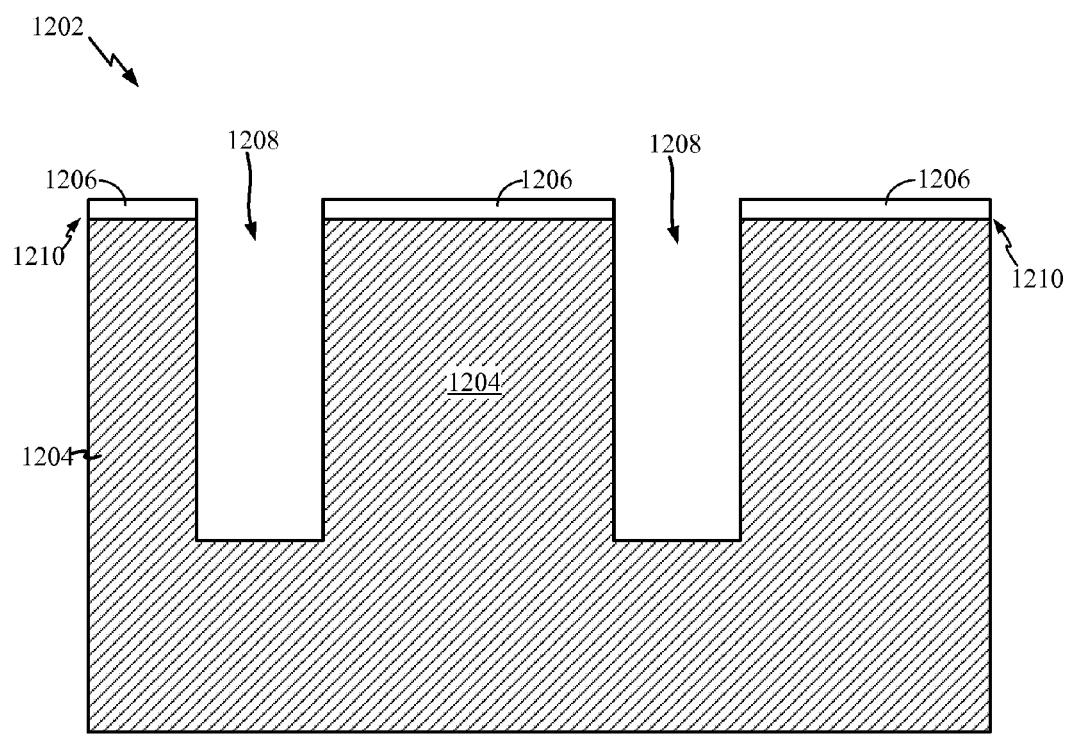
FIG. 12 is a sectional view of a second embodiment of an electronic structure having a plurality of openings formed in a substrate.
Figure 13:
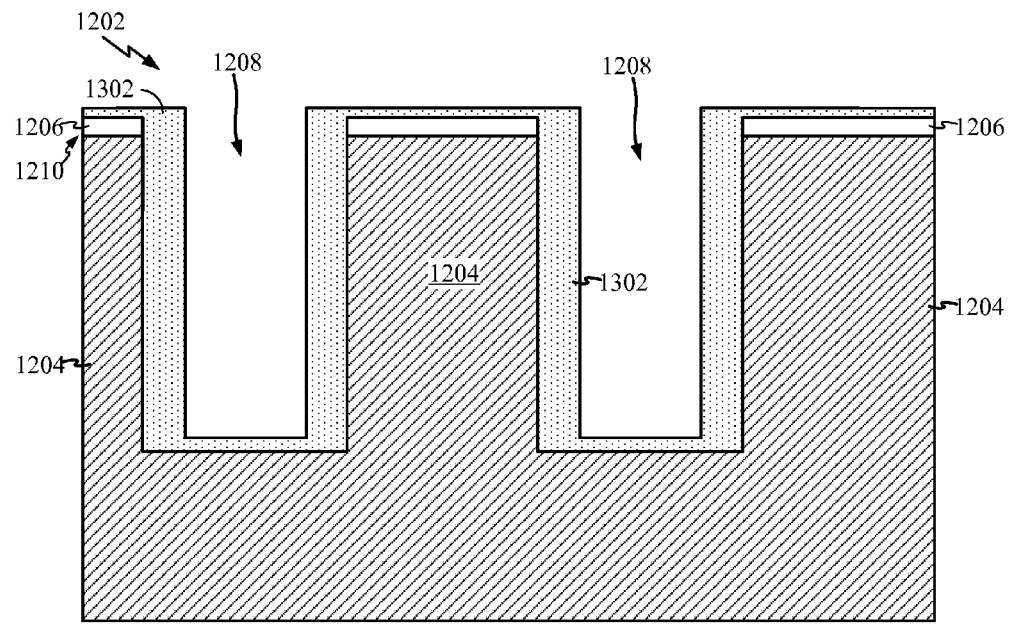
FIG. 13 is a sectional view of the electronic structure of FIG. 12 deposited with an outer insulating layer.

In an exemplary embodiment shown in FIGS. 12-20, a method of preparing a dual through via in an electronic structure is shown. In FIG. 12, an electronic structure 1202 is provided that includes a substrate 1204 with a layer of dielectric material 1206 formed near the front or top surface 1210 of the substrate 1204. A plurality of openings 1208 can then be formed therein. In FIG. 13, an insulating layer 1302 is deposited along the front or top surface 1210 of the substrate 1204 and the inner walls of the plurality of openings 1208. The insulating layer 1302, referred to as the outer insulating layer 1302, can be made of silicon dioxide ($SiO_2$), silicon oxynitride (SiON), silicon nitride ($Si_3N_4$), or any other known dielectric material.

Figure 14:
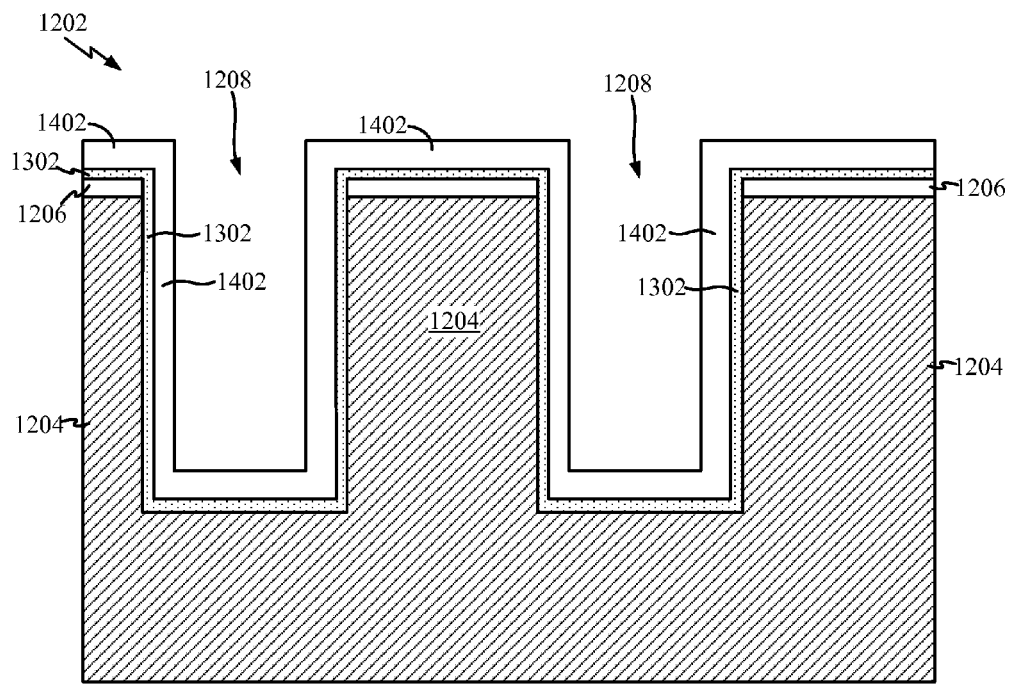
FIG. 14 is a sectional view of the electronic structure of FIG. 13 deposited with an outer conductive layer.
Figure 15:
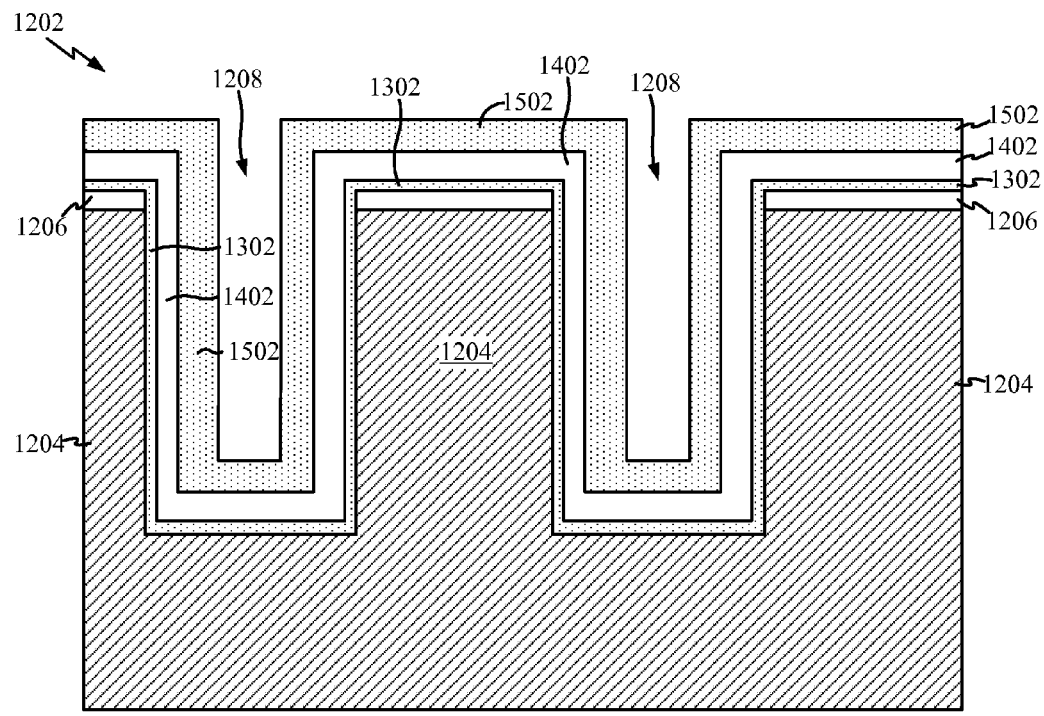
FIG. 15 is a sectional view of the electronic structure of FIG. 14 deposited with an inner insulating layer.

In FIG. 14, an outer conductive layer 1402 is deposited on top of the outer insulating layer 1302 and in the openings 1208. The outer conductive layer 1402 can be deposited by a plating or other metal material deposit process known to the skilled artisan. The outer insulating layer 1302 separates the substrate 1204 and the outer conductive layer 1402. In FIG. 15, another insulating layer 1502 is deposited on top of the outer conductive layer 1402 and in the openings 1208. The insulating layer 1502, referred to as an inner insulating layer, is separated from the outer insulating layer 1302 by the outer conductive layer 1402. The inner insulating layer 1502 can be made from silicon dioxide ($SiO_2$), silicon oxynitride (SiON), silicon nitride ($Si_3N_4$), or any other known dielectric material.

Figure 16:
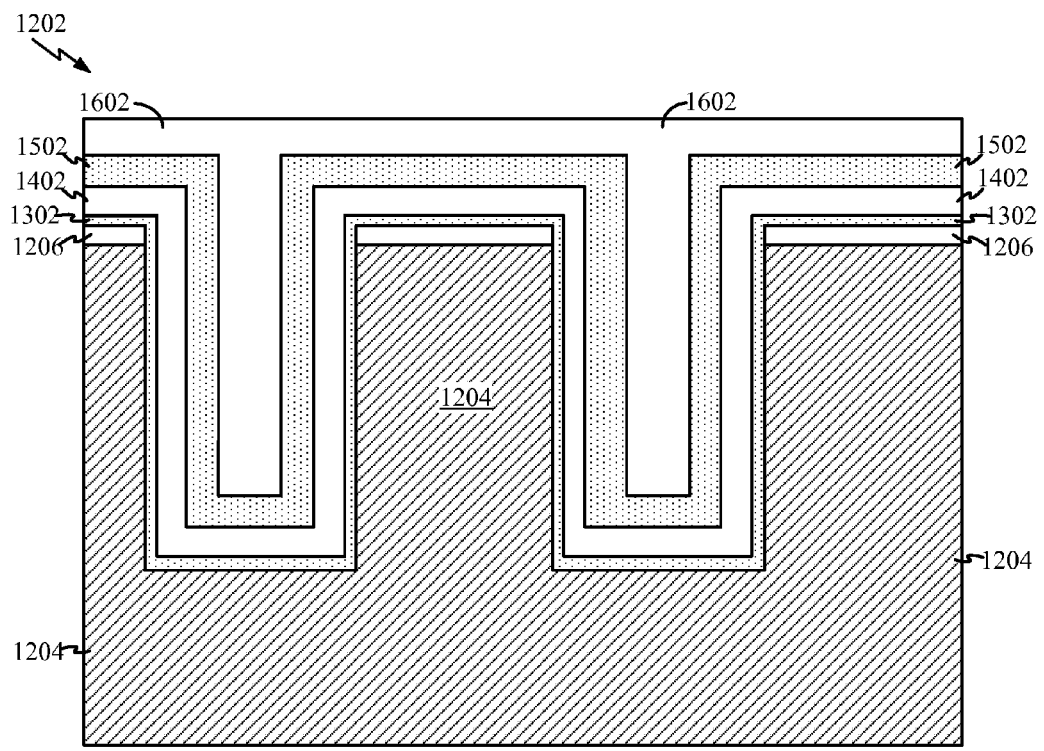
FIG. 16 is a sectional view of the electronic structure of FIG. 15 deposited with an inner conductive layer.
Figure 17:
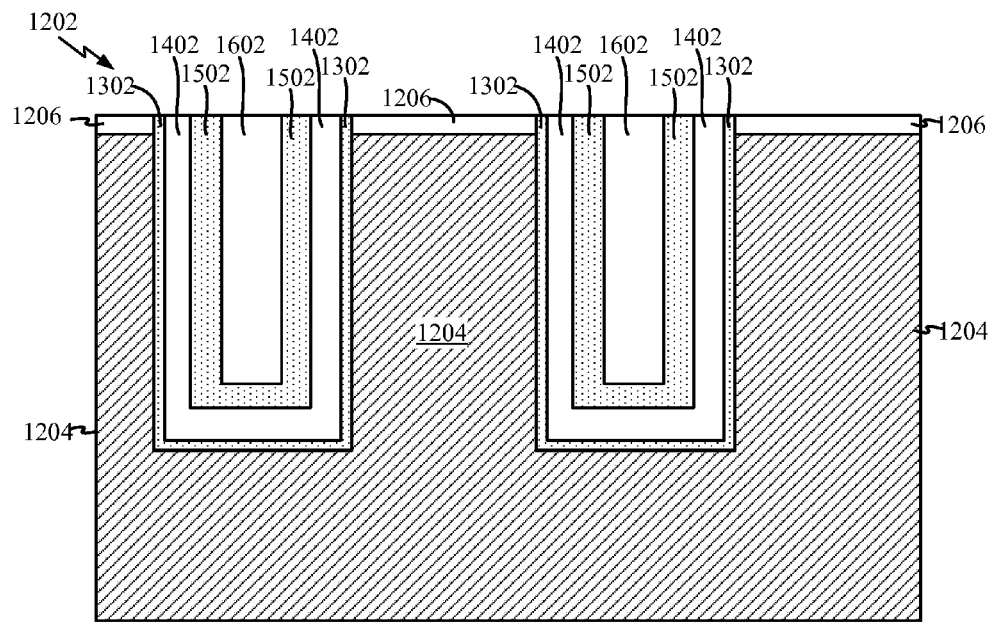
FIG. 17 is a sectional view of the electronic structure of FIG. 16 with a polished front surface of the substrate.

The openings 1208 are then filled with a conductive material to form an inner conductive layer 1602 as shown in FIG. 16. In the embodiment of FIG. 16, the inner conductive layer 1602 fills not only the openings 1208, but also forms a layer on top of the inner insulating layer 1502 near the front surface 1210 of the substrate 1204. The inner conductive layer 1602, which can be made of copper or other suitable conductive material, can be plated or deposited by an electrodeposit or other known deposit process. The top portion of the layers of FIG. 16 deposited on the substrate 1204 and dielectric material 1206 can then be etched or polished by the chemical mechanical polishing (CMP) process or other known process to remove excess material deposited during the fabrication, as shown in FIG. 17.

Figure 18:
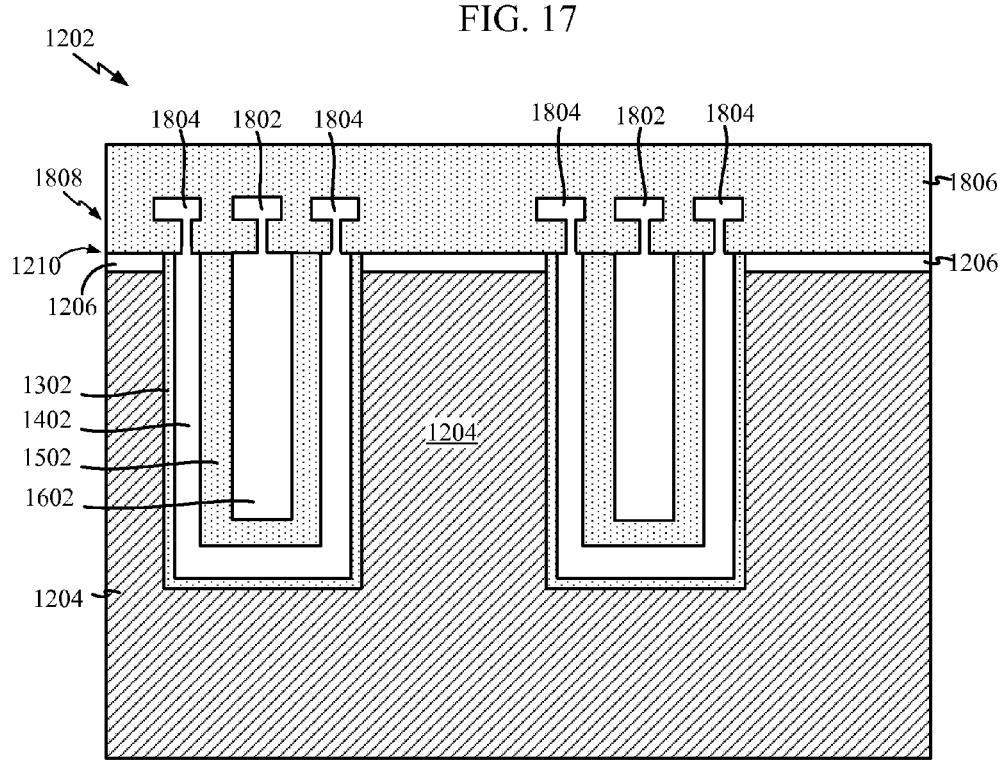
FIG. 18 is a sectional view of the electronic structure of FIG. 17 with the front side of the substrate formed with contacts.

With reference to FIG. 18, the frontside 1808 of the electronic structure 1202 can be formed using an inter-metal dielectric (IMD) process and logic damascene process or other patterning process. An inner contact 1802 can be formed near the frontside 1808 of the structure 1202 such that the inner conductive layer 1602 couples to the inner contact 1802. An outer contact 1804 can also be formed near the frontside 1808 of the structure 1202 such that the outer conductive layer 1402 couples to the outer contact 1804. It is possible to form a multilayer interconnection structure at the frontside 1808 of the electronic structure 1202 such that the inner contact 1802 and outer contact 1804 couple to different surfaces of the same layer or different layers of the electronic structure 1202.

Figure 19:
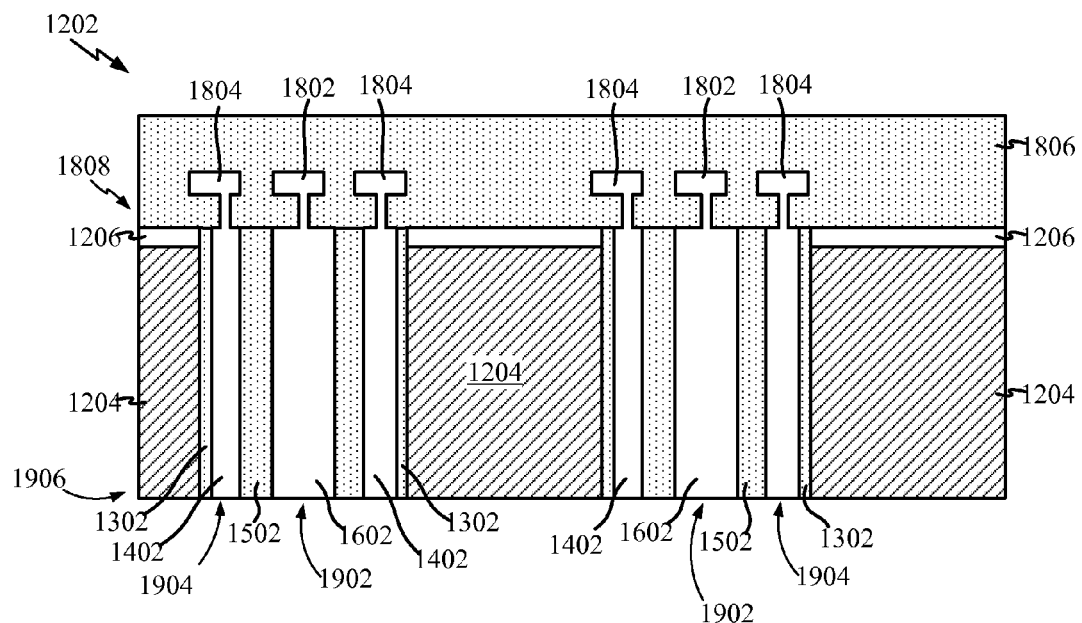
FIG. 19 is a sectional view of the electronic structure of FIG. 18 with a plurality of dual via structures.

Also, a dielectric or insulating material 1806 can fill the frontside 1808 of the electronic structure 1202 to further isolate the contacts 1802 and 1804. The dielectric or insulating material 1806 can comprise the same material as the inner insulating layer 1502 and/or the outer insulating layer 1302. Material on the backside 1906 of the substrate 1204 can be removed by an etching or thinning process to remove excess material, as shown in FIG. 19, such that a plurality of inner vias 1902 are surrounded by a plurality of outer vias 1904. The inner vias 1902 and outer vias 1904 can be through vias, and in the embodiment in which the substrate is formed from silicon, each via can be a through silicon via (TSV). Each inner via 1902 and outer via 1904 forms a dual via structure or ring-type via pair.

Figure 20:
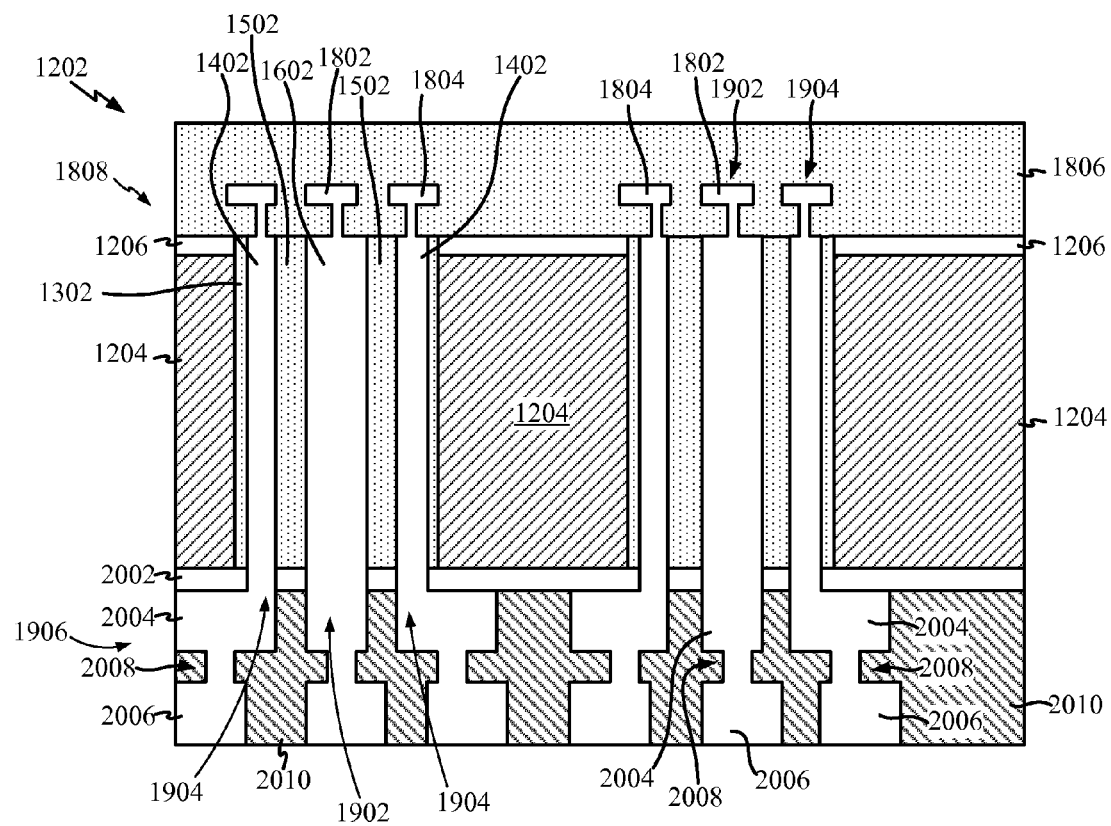
FIG. 20 is a sectional view of the electronic structure of FIG. 19 with a plurality of dual via structures with dielectric material filled on the backside of the substrate.

In FIG. 20, an electronic structure 1202 with a plurality of dual via structures is shown. The backside 1906 of the substrate 1204 can include a dielectric barrier film 2002, a first back metal layer ("Back Metal 1") 2004 and a second back metal layer ("Back Metal 2") 2006. A back via 2008 can be formed between the first back metal layer 2004 and the second back metal layer 2006. Also, a dielectric material 2010 can be filled around the first back metal layer 2004, second back metal layer 2006, and back via 2008. Additional logic back-end-of-the-line (BEOL) processes can take place as needed.

Although in the embodiment shown in FIGS. 12-20 the electronic substrate 1202 is described having a plurality of dual via structures formed therein, in other embodiments it is possible to have one or more dual via structures, individually or in arrays or clusters.

In addition, the outer conductive layers 1402 can be coupled to ground to form a shield layer that surrounds the inner conductive layer 1602. In such an embodiment, electric fields that form as a signal passes through the inner conductive layer 1602 are confined between the inner conductive layer 1602 and outer conductive layer 1402 (i.e., shield layer). As such, the strength of electromagnetic fields that are created by the signal passing through the dual via structure can be significantly reduced. Also, eddy current losses can be reduced in the substrate and mutual inductance between vias can be reduced.

In an alternative embodiment, mutual inductance can be reduced in the electronic structure 1202 by passing a first signal of a differential pair through the outer via 1904 and a second signal of the complementary pair through the inner via 1902 such that the first signal and second signal are the same but comprise opposite polarities. As such, the net current passing through the dual via structure is approximately zero, and thus the mutual inductance can be reduced substantially or eliminated altogether. Less electromagnetic noise is created as well. The impedance of the dual via structure can be tuned by adjusting the thickness of the inner conductive layer 1602, inner insulating layer 1502, outer conductive layer 1402, or and/or outer insulating layer 1302.

The additional steps of forming the inner via and outer via can be integrated into a conventional process of forming a through silicon via in a substrate. Once a shielded through via structure or dual via structure is prepared in a substrate, the substrate can be incorporated into an assembly or package for use in an electronic device, such as a cell phone, computer, personal digital assistant (PDA), and the like.

Figure 21:
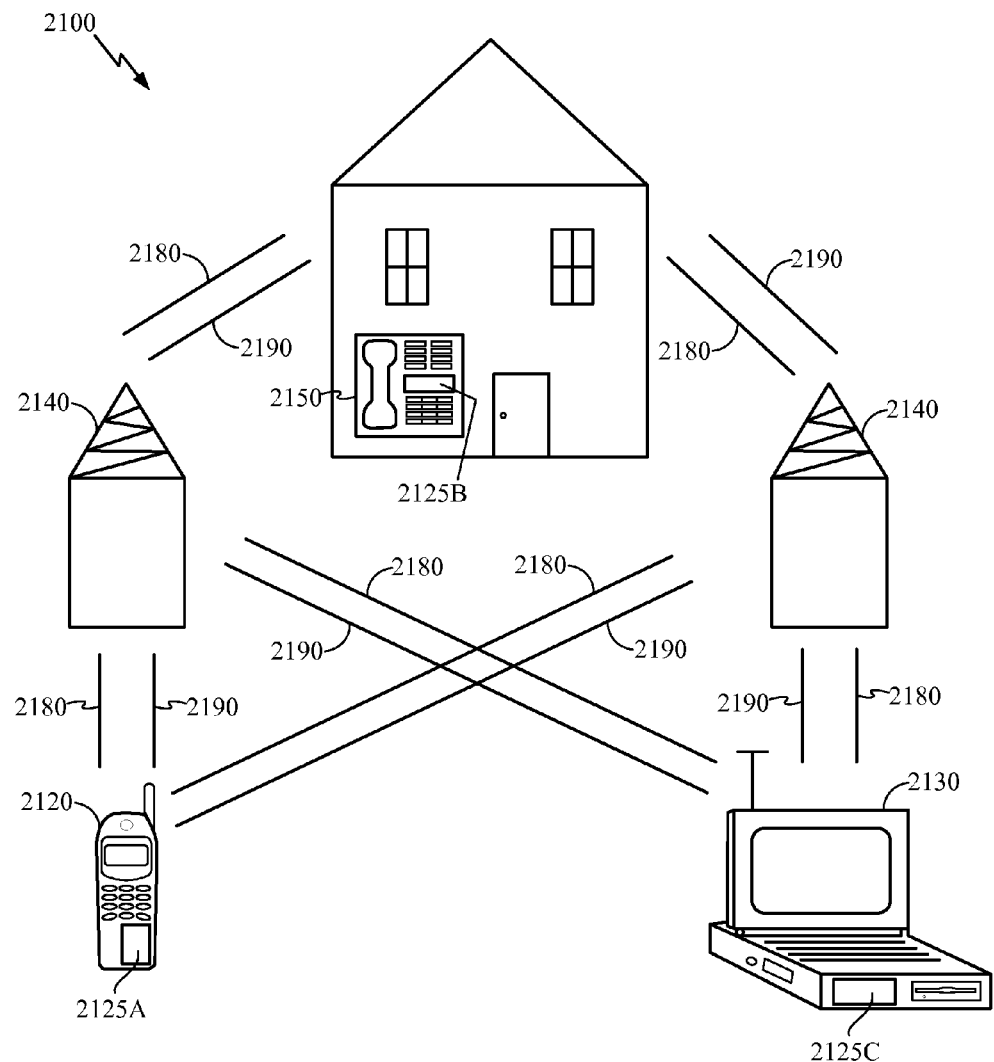
FIG. 21 is a block diagram showing an exemplary wireless communication system in which a memory power management system supporting multiple power modes may be advantageously employed.

FIG. 21, for example, shows an exemplary wireless communication system 2100 in which an embodiment of a via structure may be advantageously employed. For purposes of illustration, FIG. 21 shows three remote units 2120, 2130, and 2150 and two base stations 2140. It should be recognized that typical wireless communication systems may have many more remote units and base stations. Any of remote units 2120, 2130, and 2150 may include a system of via structures disposed in a substrate such as disclosed herein. FIG. 21 shows forward link signals 2180 from the base stations 2140 and the remote units 2120, 2130, and 2150 and reverse link signals 2190 from the remote units 2120, 2130, and 2150 to base stations 2140.

In FIG. 21, remote unit 2120 is shown as a mobile telephone, remote unit 2130 is shown as a portable computer, and remote unit 2150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 21 illustrates certain exemplary remote units that may include a system of via structures as disclosed herein, the system of via structures is not limited to these exemplary illustrated units. Embodiments may be suitably employed in any electronic device in which a system of via structures is desired.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A substrate including a first through substrate via structure comprising:
    an outer conductive layer disposed in the substrate;
    an inner insulating layer disposed in the substrate, the outer conductive layer separating the inner insulating layer and the substrate;
    an inner conductive layer disposed in the substrate, the inner insulating layer separating the inner conductive layer and the outer conductive layer; and
    a salicide film comprising a ring like structure surrounding an outer portion of the first through substrate via structure, the salicide film coupled to the outer conductive layer and a conductive interconnect layer;
    wherein, a first signal of a first complementary pair passes through the inner conductive layer and a second signal of the first complementary pair passes through the outer conductive layer.

2. The apparatus of claim 1, further comprising an outer insulating layer disposed in the substrate, the outer insulating layer separating the outer conductive layer and the substrate.

3. The apparatus of claim 1, wherein the first signal and second signal comprise substantially opposite polarities.

4. The substrate of claim 1, further comprising a second through substrate via structure disposed adjacent to the first via structure, the second via structure comprising:
    an inner conductive layer and an outer conductive layer disposed in the substrate, the outer conductive layer surrounding the inner conductive layer; and
    an inner insulating layer disposed between the outer conductive layer and the inner conductive layer;
    wherein, a first signal of a second complementary pair passes through the inner conductive layer and a second signal of the second complementary pair passes through the outer conductive layer.

5. The apparatus of claim 4, wherein the second signal of the first complementary pair and the second signal of the second complementary pair comprise substantially opposite polarities.

6. The apparatus of claim 1, wherein the outer conductive layer comprises titanium, titanium nitride, tantalum, tantalum nitride, or a combination thereof.

7. The apparatus of claim 1, integrated into a mobile phone, a set top box, a music player, a video player, an entertainment unit, a navigation device, a computer, a hand-held personal communication systems (PCS) unit, a portable data unit, and/or a fixed location data unit.

8. A substrate including a first through substrate via structure comprising:
   an outer conductive means disposed in the substrate;
   an inner insulating means disposed in the substrate, the outer conductive means separating the inner insulating means and the substrate;
   an inner conductive means disposed in the substrate, the inner insulating means separating the inner conductive means and the outer conductive means; and
   a salicide film formed in a ring-like structure surrounding an outer portion of the first through substrate via structure, the salicide film coupled to the outer conductive means and a conductive interconnect layer;
   in which, a first signal of a first complementary pair passes through the inner conductive means and a second signal of the first complementary pair passes through the outer conductive means.

9. The apparatus of claim 8, integrated into a mobile phone, a set top box, a music player, a video player, an entertainment unit, a navigation device, a computer, a hand-held personal communication systems (PCS) unit, a portable data unit, and/or a fixed location data unit.

* * * * *